(12) United States Patent
Huh et al.

(10) Patent No.: US 7,863,602 B2
(45) Date of Patent: Jan. 4, 2011

(54) ORGANIC LIGHT EMITTING DIODE DISPLAY AND METHOD FOR MANUFACTURING THE SAME

(75) Inventors: Jong-Moo Huh, Hwasung-si (KR); Seung-Kyu Park, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 1079 days.

(21) Appl. No.: 11/603,650

(22) Filed: Nov. 21, 2006

(65) Prior Publication Data

US 2007/0120143 A1    May 31, 2007

(30) Foreign Application Priority Data

Nov. 25, 2005  (KR) .................. 10-2005-0113407

(51) Int. Cl.
*H01L 35/24* (2006.01)
*H01L 51/00* (2006.01)

(52) U.S. Cl. .................. 257/40; 313/500; 313/501
(58) Field of Classification Search .......... 257/40; 313/500, 501
See application file for complete search history.

(56) References Cited

U.S. PATENT DOCUMENTS

| | | | |
|---|---|---|---|
| 5,879,976 A * | 3/1999 | Fujiwara .................. | 438/163 |
| 6,159,779 A | 12/2000 | Huang et al. | |
| 6,673,661 B1 | 1/2004 | Liu et al. | |
| 7,557,376 B2 * | 7/2009 | Maki et al. .................. | 257/70 |
| 2001/0035863 A1 * | 11/2001 | Kimura .................. | 345/205 |
| 2001/0038098 A1 * | 11/2001 | Yamazaki et al. .......... | 257/72 |

FOREIGN PATENT DOCUMENTS

| | | |
|---|---|---|
| JP | 7-38110 | 2/1995 |
| JP | 7-74365 | 3/1995 |
| JP | 2003-17708 | 1/2003 |
| JP | 2003-29299 | 1/2003 |
| JP | 2004-63717 | 2/2004 |
| JP | 2005-72144 | 3/2005 |
| KR | 2000-0052006 | 8/2000 |
| KR | 10-2004-0013273 | 2/2004 |
| KR | 10-2004-0037886 | 5/2004 |

(Continued)

OTHER PUBLICATIONS

Machine Translation of JP 2004-063717.*

(Continued)

*Primary Examiner*—Eugene Lee
*Assistant Examiner*—Anthony Ho
(74) *Attorney, Agent, or Firm*—Innovation Counsel LLP

(57) ABSTRACT

In one embodiment, an organic light emitting diode (OLED) display is provided. The OLED display includes a substrate, a first signal line formed on the substrate, a second signal line intersecting the first signal line, a first thin film transistor connected to the first and second signal lines, a second thin film transistor connected to the first thin film transistor, a first electrode connected to the second thin film transistor, a second electrode provided at least partially opposite to the first electrode, and a light emitting member formed between the first electrode and the second electrode, wherein at least one of the first thin film transistor and the second thin film transistor includes a plurality of semiconductor layers having different crystallinity.

22 Claims, 19 Drawing Sheets

FOREIGN PATENT DOCUMENTS

| KR | 10-2004-0083353 | 5/2004 |
|---|---|---|
| KR | 10-2004-0095798 | 11/2004 |
| KR | 10-2004-0105249 | 12/2004 |
| KR | 10-2004-0105359 | 12/2004 |
| KR | 10-2005-0012957 | 2/2005 |

OTHER PUBLICATIONS

Patent Abstracts of Japan, Publication No. 07-038110, Feb. 7, 1995, 1 p.
Patent Abstracts of Japan, Publication No. 07-074365, Mar. 17, 1995, 2 pp.
Patent Abstracts of Japan, Publication No. 2003-017708, Jan. 17, 2003, 1 p.
Patent Abstracts of Japan, Publication No. 2003-029299, Jan. 29, 2003, 4 pp.
Patent Abstracts of Japan, Publication No. 2004-063717, Feb. 26, 2004, 1 p.
Patent Abstracts of Japan, Publication No. 2005-072144, Mar. 17, 2005, 1 p.
Korean Patent Abstracts, Publication No. 1020000052006, Aug. 16, 2000, 1 p.
Korean Patent Abstracts, Publication No. 1020040013273, Feb. 14, 2004, 1 p.
Korean Patent Abstracts, Publication No. 1020040037886, May 8, 2004, 1 p.
Korean Patent Abstracts, Publication No. 1020040083353, Oct. 1, 2004, 1 p.
Korean Patent Abstracts, Publication No. 1020040095798, Nov. 16, 2004, 1 p.
Korean Patent Abstracts, Publication No. 10-2004-0105249, Dec. 14, 2004, 1 p.
Korean Patent Abstracts, Publication No. 1020040105359, Dec. 16, 2004, 1 p.
Korean Patent Abstracts, Publication No. 1020050012957, Feb. 2, 2005, 1 p.

* cited by examiner

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2005-0113407 filed in the Korean Intellectual Property Office on Nov. 25, 2005, the entire contents of which are incorporated herein by reference.

BACKGROUND (a) Field of the Invention

The present invention relates to an organic light emitting diode display and a method for manufacturing the same.

(b) Description of the Related Art

Recent trends towards lightweight and thin personal computers and television sets require lightweight and thin display devices, and flat panel displays satisfying such requirements are being substituted for conventional cathode ray tubes (CRT).

The flat panel displays may include a liquid crystal display (LCD), a field emission display (FED), an organic light emitting diode (OLED) display, a plasma display panel (PDP), and so on. Among the flat panel displays, the OLED display is the most promising because of its low power consumption, fast response time, wide viewing angle, and high contrast ratio.

An OLED display is a self-emissive display device that includes two electrodes and an organic light emitting layer interposed therebetween. One of the two electrodes injects holes and the other of the two electrodes injects electrons into the light emitting layer. The injected electrons and holes are combined to form exitons, and the exitons emit light as discharge energy.

The OLED displays may be categorized by their driving method into passive matrix OLED displays and active matrix OLED displays. The passive matrix OLED display includes a plurality of anode lines, a plurality of cathode lines intersecting the anode lines, and a plurality of pixels, each including a light emission layer. The selection of one of the anode lines and one of the cathode lines causes light emission of the pixel located at the intersection of the selected signal lines. The active matrix OLED display includes a plurality of pixels, each including a switching transistor, a driving transistor, and a storage capacitor, as well as an anode, a cathode, and a light emission layer. The driving transistor receives a data voltage from the switching transistor and drives a current having a magnitude depending on the data voltage, and the current from the driving transistor enters the light emission layer to cause light emission having intensity depending on the current.

Characteristics of the switching transistor and the driving transistor for optimizing characteristics of the OLED display are different from each other. That is, the switching transistor requires a high current on/off characteristic Ion/Ioff, while the driving transistor requires high mobility and high stability for flowing sufficient current to the OLED.

When an off current of the switching transistor increases, a data voltage applied to the driving transistor decreases such that cross-talk may occur. In addition, when the mobility and the stability of the driving transistor are low, the current amount flowing to the OLED decreases such that the amount of light emitted by the OLED decreases, image sticking occurs, and the lifetime of the OLED is reduced.

SUMMARY

An embodiment of the present invention provides an organic light emitting diode (OLED) display, which includes a substrate, a first signal line formed on the substrate, a second signal line intersecting the first signal line, a first thin film transistor connected to the first and second signal lines, a second thin film transistor connected to the first thin film transistor, a first electrode connected to the second thin film transistor, a second electrode provided at least partially opposite to the first electrode, and a light emitting member formed between the first electrode and the second electrode, wherein at least one of the first thin film transistor and the second thin film transistor includes a plurality of semiconductor layers having different crystallinity.

Another embodiment of the present invention provides an organic light emitting diode (OLED) display, which includes a substrate, a first signal line formed on the substrate, a second signal line intersecting the first signal line, a driving voltage line formed on the substrate and substantially in parallel to the first signal line or the second signal line, a first thin film transistor comprising a first control electrode connected to the first signal line, a first input electrode connected to the second signal line, a first output electrode opposite to the first input electrode, and a first semiconductor layer overlapping portions of the first input electrode and the first output electrode, a second thin film transistor comprising a second control electrode connected to the first output electrode, a second input electrode connected to the driving voltage line, a second output electrode opposite to the second input electrode, and a second semiconductor layer overlapping portions of the second input electrode and the second output electrode, a first electrode connected to the second output electrode, a second electrode provided at least partially opposite to the first electrode, and a light emitting member formed between the first electrode and the second electrode, wherein the first control electrode and the second control electrode are formed on different layers from each other.

Yet another embodiment of the present invention provides a method for manufacturing an organic light emitting diode display, which includes forming a gate line including a first control electrode on a substrate, forming a first gate insulating layer, a lower semiconductor layer, and an upper semiconductor layer on the substrate, etching the upper semiconductor layer and the lower semiconductor layer to form a first semiconductor layer including a first lower semiconductor layer and a first upper semiconductor layer and a second semiconductor layer including a second lower semiconductor layer and a second upper semiconductor layer, forming and etching a conductive layer on the first semiconductor layer and the second semiconductor layer to form data conductors including a data line having a first input electrode, a first output electrode, a driving voltage line having a second input electrode, and a second output electrode, etching the first upper semiconductor layer using the first input electrode and the second output electrode as a mask, forming a second gate insulating layer on the data conductors, forming a second control electrode connected to the first output electrode on the second gate insulating layer, forming a first electrode connected to the second output electrode on the second gate insulating layer, forming a light emitting member on the first electrode, and forming a second electrode on the light emitting member.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The present invention will become more apparent by describing embodiments thereof in detail with reference to the accompanying drawings in which.

Figure 1:
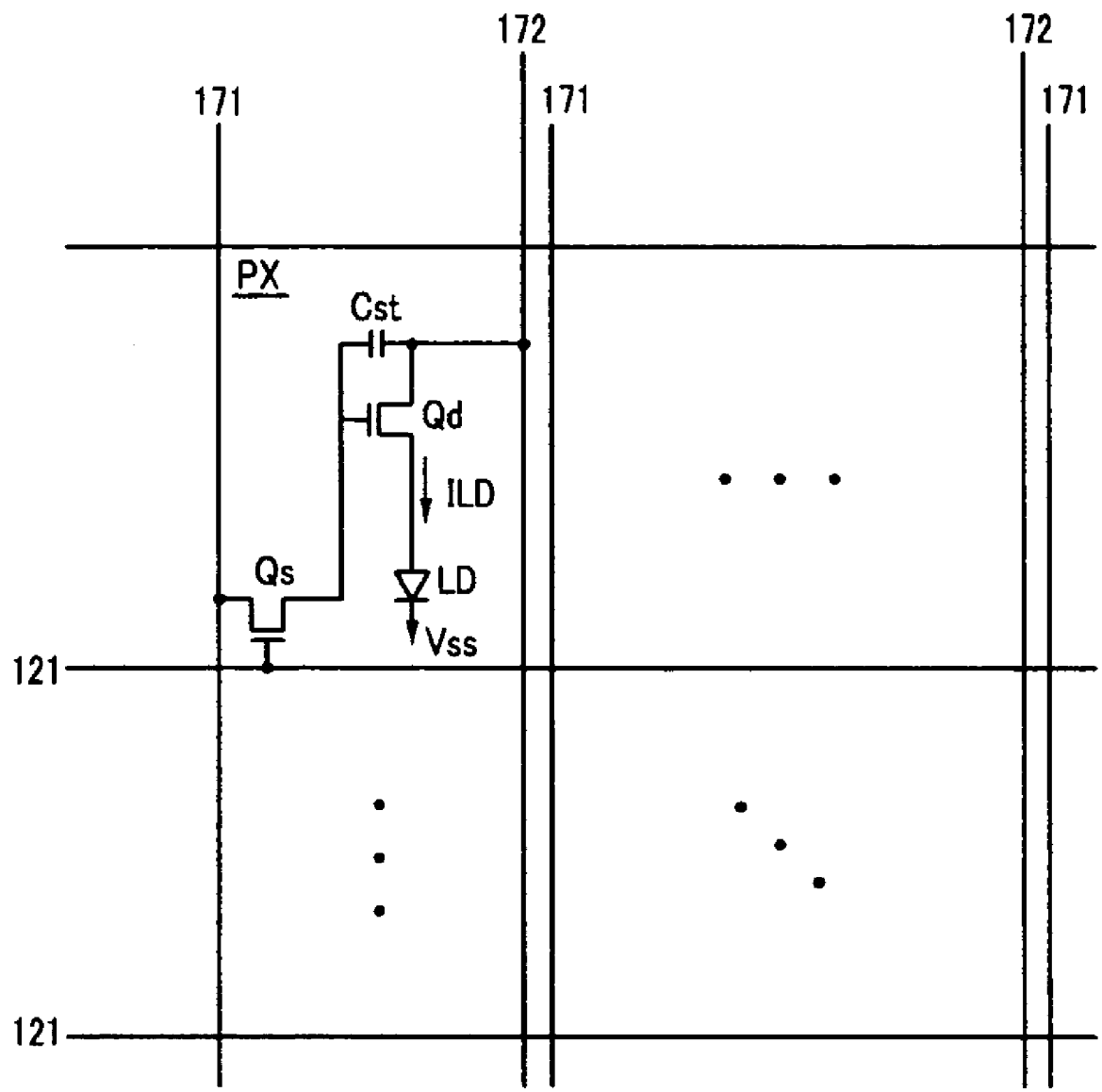
FIG. 1 is an equivalent circuit diagram of an OLED display according to an embodiment of the present invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION OF THE EMBODIMENTS

The present invention will be described more fully hereinafter with reference to the accompanying drawings, in which embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

First, an OLED display according to an embodiment of the present invention is described in detail with reference to FIG. 1. FIG. 1 is an equivalent circuit diagram of an OLED display according to an embodiment of the present invention.

Referring to FIG. 1, an OLED display according to an embodiment of the present invention includes a plurality of signal lines 121, 171, and 172 and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, while the data lines 171 and the driving voltage lines 172 extend substantially in a column direction and substantially parallel to each other.

Each pixel PX includes a switching transistor Qs, a driving transistor Qd, a capacitor Cst, and an OLED LD. The switching transistor Qs, such as a TFT, has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal being applied to the gate line 121.

The driving transistor Qd, such as a TFT, has a control terminal connected to the switching transistor Qs, an input terminal connected to the driving signal line 172, and an output terminal connected to the OLED LD. The driving transistor Qd drives an output current ILD having a magnitude depending on the voltage between the control terminal and the output terminal thereof.

The capacitor Cst is connected between the control terminal and the output terminal of the driving transistor Qd. The capacitor Cst stores the data signal applied to the control terminal of the driving transistor Qd and maintains the data signal after the switching transistor Qd turns off.

The OLED LD has an anode connected to the output terminal of the driving transistor Qd and a cathode connected to a common voltage Vss. The OLED LD emits light having an intensity depending on an output current $I_{LD}$ of the driving transistor Qd, thereby displaying images.

Figure 2:
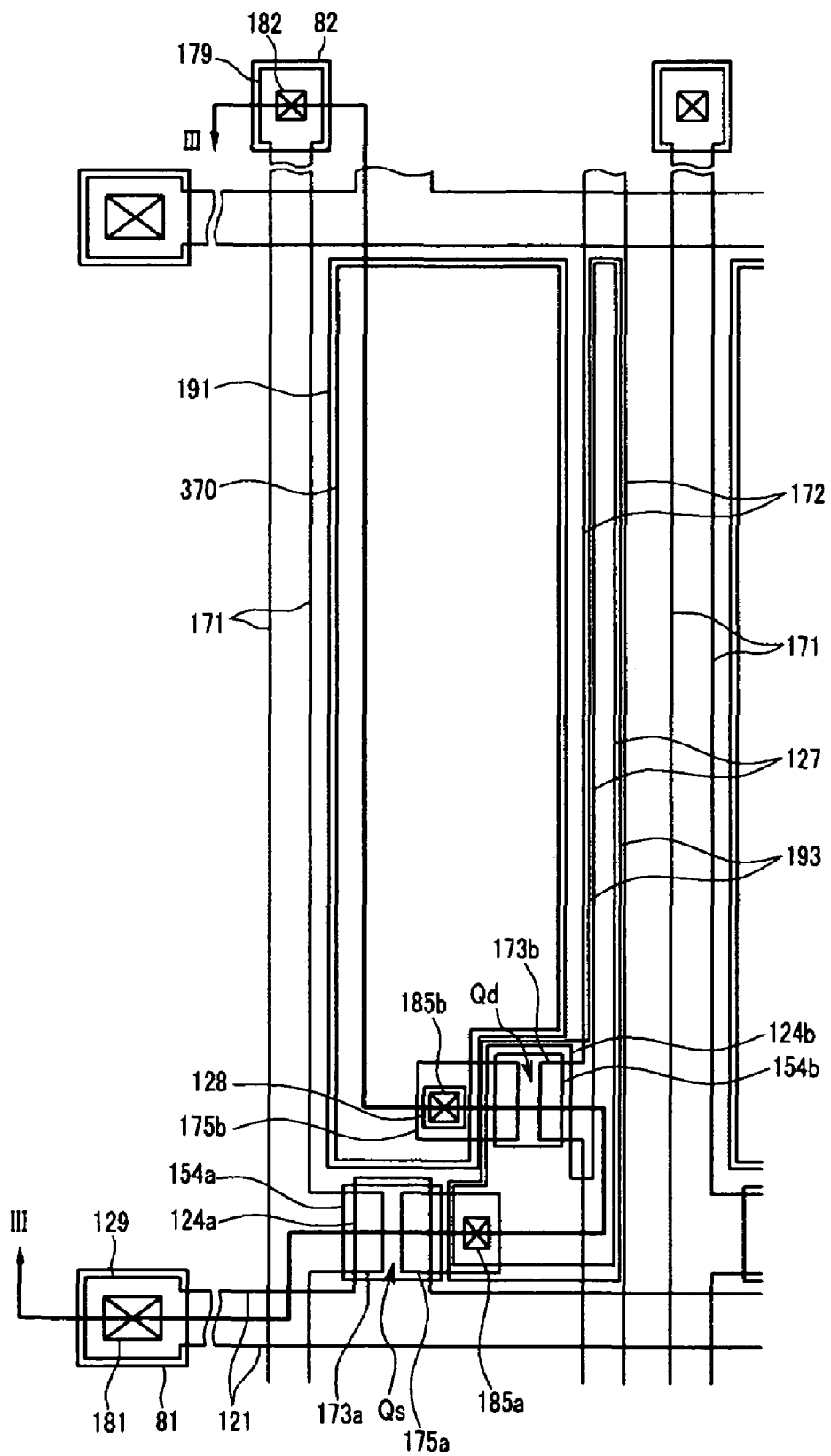
FIG. 2 is a layout view of an OLED display according to an embodiment of the present invention.
Figure 3:
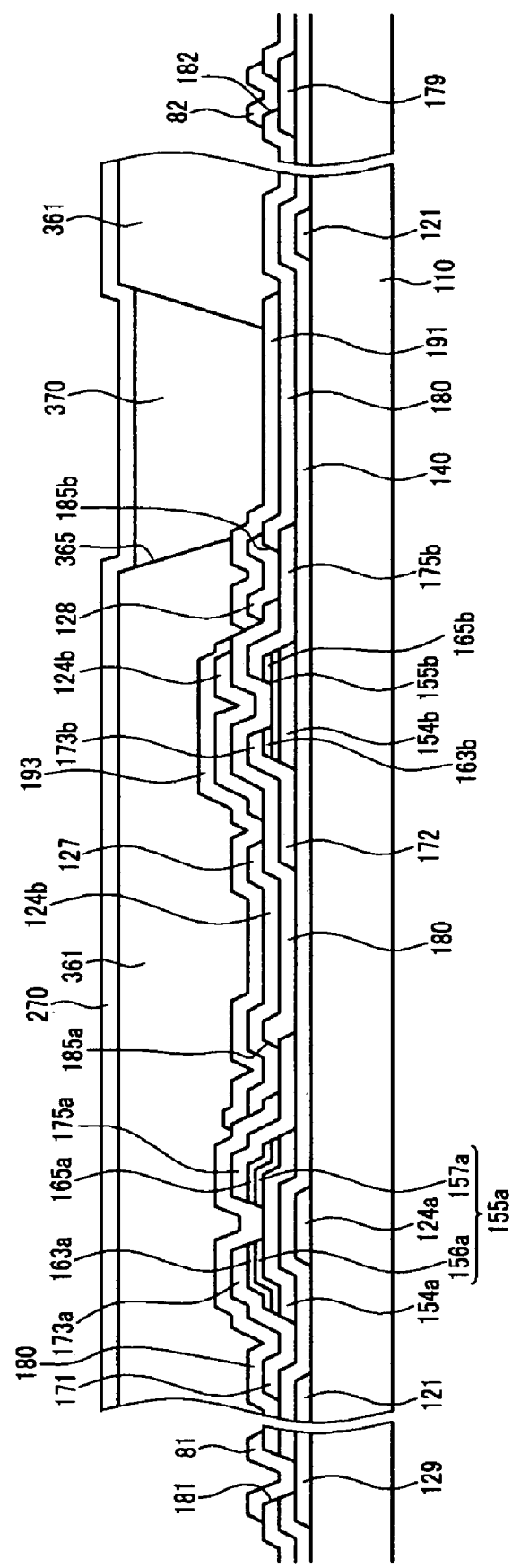
FIG. 3 is a sectional view of the OLED display shown in FIG. 2 taken along the lines III-III.

The switching transistor Qs and the driving transistor Qd are n-channel field effect transistors (FETs). However, at least one of switching transistor Qs and the driving transistor Qd may be a p-channel FET. In addition, the connections among the transistors Qs and Qd, the capacitor Cst, and the OLED LD may be modified. Referring to FIGS. 2 and 3, a detailed structure of the OLED display shown in FIG. 1 will be described in detail according to an embodiment of the present invention. FIG. 2 is a layout view of an OLED display according to an embodiment of the present invention, and FIG. 3 is a sectional view of the OLED display shown in FIG. 2 taken along the lines III-III. A plurality of gate lines 121 including first control electrodes 124a are formed on an insulating substrate 110 made of a material such as transparent glass or plastic. The gate lines 121 for transmitting gate signals extend substantially in a transverse direction. Each gate line 121 further includes an end portion 129 having a large area for contact with another layer or an external driving circuit, and the first control electrodes 124a project upward from the gate line 121. The gate lines 121 may extend to be directly connected to a gate driving circuit (not shown) for generating the gate signals, which may be integrated on the substrate 110. The gate lines 121 may be made of an Al-containing metal such as Al or an Al alloy, a Ag-containing metal such as Ag or an Ag alloy, a Cu-containing metal such as Cu or a Cu alloy, a Mo-containing metal such as Mo or a Mo alloy, or metals containing Cr, Ta, Ti, etc. The gate conductors 121 and 124b may have a multi-layered structure including two films having different physical characteristics. The lateral sides of the gate lines 121 are inclined relative to a surface of the substrate 110, and the inclination angle thereof may range from about 30 to 80 degrees in one example.

A lower gate insulating layer 140 made of silicon nitride (SiNx) or silicon oxide (SiOx), in one example, is formed on the gate lines 121.

A plurality of first and second lower semiconductor islands 154a and 154b are made of hydrogenated amorphous silicon (abbreviated to "a-Si"), etc., in one example, and are formed on the lower gate insulating layer 140. The first lower semiconductor islands 154a are disposed on the first control electrodes 124a.

A plurality of first and second upper semiconductor islands 155a and 155b are formed on the first and second lower semiconductor islands 154a and 154b. Each of the first upper semiconductor islands 155a includes a pair of first and second portions 156a and 157a that are separated from each other by a predetermined distance on the first lower semiconductor island 154a. The second upper semiconductor islands 155b have almost the same planar shapes as the underlying second upper semiconductor islands 154b. The first and second upper semiconductor islands 155a and 155b are made of microcrystalline silicon or polycrystalline silicon in one example.

A plurality of pairs of first ohmic contact islands 163a and 165a and a plurality of pairs of second ohmic contact islands 163b and 165b are formed on the first and second upper semiconductor islands 155a and 155b, respectively. The first ohmic contacts 163a and 165a have almost the same planar shapes as the first and second portions 156a and 157a of the first upper semiconductor islands 155a, respectively. In one example, the ohmic contacts 163a, 163b, 165a, and 165b are made of microcrystalline silicon or n+hydrogenated a-Si heavily doped with an n-type impurity such as phosphorous.

A plurality of data conductors including a plurality of data lines 171, a plurality of driving voltage lines 172, and a plurality of first and second output electrodes 175a and 175b are formed on the ohmic contacts 163a, 163b, 165b, and 165b and the lower gate insulating layer 140.

The data lines 171 for transmitting data signals extend substantially in the longitudinal direction and intersect the gate lines 121. Each data line 171 includes a plurality of first input electrodes 173a extending toward the first control electrodes 124a and an end portion 179 having a large area for contact with another layer or an external driving circuit. The data lines 171 may extend to be directly connected to a data driving circuit (not shown) for generating the data signals, which may be integrated on the substrate 110.

The driving voltage lines 172 for transmitting driving voltages extend substantially in the longitudinal direction and intersect the gate lines 121. Each driving voltage line 172 includes a plurality of second input electrodes 173b.

The first and second output electrodes 175a and 175b are separated from each other and from the data lines 171 and the driving voltage lines 172. Each pair of the first input electrodes 173a and the first output electrodes 175a are disposed opposite each other with respect to a first lower semiconductor island 154a, and each pair of the second input electrodes 173b and the second output electrodes 175b are disposed opposite each other with respect to an upper semiconductor island.

The data conductors 171, 172, 175a, and 175b are made of a low resistivity metal including Al, Cu, Ag, or alloys thereof, in one example, or a refractory metal including Mo, Cr, Ta, Ti, or alloys thereof, in another example. They may have a multi-layered structure including a refractory metal film and a low resistivity film in one example. Like the gate lines 121, the data conductors 171, 172, 175a, and 175b have inclined edge profiles, and the inclination angles thereof may range from about 30 to 80 degrees in one example.

An upper gate insulating layer 180 is formed on the data conductors 171, 172, 175a, and 175b and the exposed portions of the semiconductor islands 154a and 155b. The upper gate insulating layer 180 also functions as a passivation layer for protecting the data conductors 171, 172, 175a, and 175b.

The upper gate insulating layer 180 has a plurality of contact holes 185a, 185b, and 182 exposing the first output electrodes 175a, the second output electrodes 175b, and the end portions 179 of the data lines 171, respectively, and the upper gate insulating layer 180 and the lower gate insulating layer 140 have a plurality of contact holes 181 exposing the end portions 129 of the gate lines 121.

A plurality of control electrodes 124b and a plurality of auxiliary members 128 are formed on the upper gate insulating layer 180. Each of the second control electrodes 124b overlaps a second upper semiconductor island 155b and includes a storage electrode 127 extending downward from the second control electrode 124b and extending upward after curving in a rightward direction. The storage electrodes 127 overlap the driving voltage lines 172. The second control electrodes 124b are connected to the first output electrodes 175a through the contact holes 185a. The auxiliary members 128 are separated from the second control electrodes 124b and connected to the second output electrodes 175b through the contact holes 185b. The second control electrodes 124b and the auxiliary members 128 may be made of the same material as the gate lines 121 in one example. The second control electrodes 124b and the auxiliary members 128 have inclined edge profiles, and the inclination angles thereof may range from about 30 to 80 degrees in one example.

A plurality of pixel electrodes 191, a plurality of protecting members 193, and a plurality of contact assistants 81 and 82 are formed on the second control electrodes 124b, the auxiliary members 128, and the upper gate insulating layer 180, and they are made of a transparent conductor such as ITO or IZO in one example. Alternatively, when the OLED display according to an embodiment of the present invention is a top-emission type, the pixel electrodes 191, the protecting members 193, and the contact assistants 81 and 82 may be made of an opaque material such as Al or an Al alloy, Au, Pt, Ni, Cu, or W that have a high work function, or alloys thereof.

The pixel electrodes 191 are electrically connected to the second output electrodes 175b through the auxiliary members 128. The auxiliary members 128 enhance the adhesion between the pixel electrodes 191 and the second output electrodes 175, and protect the underlying conductor against acidic or base chemical solutions such as an etchant, a developer, or a photoresist striper, etc., that are used for patterning the pixel electrodes 191.

The protecting members 193 cover the second control electrodes 124b. The protecting members 193 are formed on the second control electrodes 124b, and thereby protect the second control electrodes 124b, which are made of a material having low chemical resistance, from damage by chemical solutions in subsequent processes.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

A partition 361 is formed on the pixel electrodes 191, the protecting members 193, and the upper gate insulating layer 180. The partition 361 surrounds the pixel electrodes 191 like a bank to define openings 365. In one example, the partition 361 may be made of an organic material having thermal resistance and solvent resistance such as acrylic resin or polyimide resin, etc., or an inorganic insulating material such as $SiO_2$ and $TiO_2$, etc., and it may have a double-layered structure. The partition 361 may be made of a photosensitive material containing a black pigment so that the black partition 361 may serve as a light blocking member and the formation of the partition 361 may be simplified.

A plurality of organic light emitting members 370 are formed on the pixel electrodes 191 and confined in the openings 365 defined by the partition 361. Each of the organic light emitting members 370 may have a multi-layered structure including an emitting layer (not shown) for emitting light and auxiliary layers (not shown) for improving the efficiency of light emission of the emitting layer. In one example, the light emitting layers are made of an organic material or a mixture of an organic material and an inorganic material uniquely emitting one of primary color lights such as red, green, and blue, or they may include a compound doped with a polyfluorene derivative, a (poly)paraphenylenevinylene derivative, a polyphenylene derivative, a polyfluorene derivative, polyvinylcarbazole, a polythiophene derivative or a compound adding a perylene-containing pigment, a cumarine-containing pigment, a rhodamine group pigment, rubrene, perylene, 9,10-diphenylanthracene, tetraphenylbutadiene, Nile red, and coumarin, quinacridone, etc. to a high polymer of the derivatives. The OLED display displays images by spatially adding the monochromatic primary color lights emitted from the light emitting layers.

The auxiliary layers may include an electron transport layer (not shown) and a hole transport layer (not shown) for improving the balance of the electrons and holes, and an electron injecting layer (not shown) and a hole injecting layer (not shown) for improving the injection of the electrons and holes, and the auxiliary layers may include one or more of the layers. In one example, the hole transport layer and the hole injecting layer are made of a material having a work function of a magnitude that is intermediate between that of the pixel electrode 191 and the emitting layer, and the electron transport layer and the electron injecting layer are made of a material having a work function that is intermediate between that of a common electrode 270 and the light emitting layers. For instance, the hole transport layer and the hole injecting layer may include poly-(3,4-ethylenedioxythiophene:polystyrenesulfonate (PEDOT:PSS), etc.

The common electrode 270 is formed on the organic light emitting members 370 and the partition 361. The common electrode 270 is formed on the entire surface of the organic light emitting members 370, and applies a current to the organic light emitting member 370 along with the pixels electrodes 191.

In the above-described OLED display, a first control electrode 124a connected to a gate line 121, a first input electrode 173a connected to a data line 171, and a first output electrode 175a along with a first lower semiconductor island 154a form a switching TFT Qs having a channel formed in the first lower semiconductor island 154a disposed between the first input electrode 173a and the first output electrode 175a. Likewise, a second control electrode 124b connected to a first output electrode 155a, a second input electrode 173b connected to a driving voltage line 172, and a second output electrode 175b connected to a pixel electrode 191 along with a second upper semiconductor island 155b form a driving TFT Qd having a channel formed in the second upper semiconductor island 155b disposed between the second input electrode 173b and the second output electrode 175b.

As described above, in one example, the first lower semiconductor islands 154a are made of an amorphous semiconductor material and the second upper semiconductor islands 155b are made of a microcrystalline or polycrystalline semiconductor material. Thereby, channels of the switching TFT and the driving TFT are formed in a semiconductor having different crystallinity. That is, in one example, a channel of a switching TFT is formed in the amorphous semiconductor and a channel of a driving TFT is formed in the microcrystalline or polycrystalline semiconductor. Alternatively, the crystallinity of the semiconductor layers may be switched.

Thereby, when the channel of the driving TFT is formed in the microcrystalline or polycrystalline semiconductor, the driving TFT may have high carrier mobility and stability, and thereby a current amount flowing in an OLED increases to improve luminance of the OLED. In addition, threshold voltage mobility due to application of a continued positive voltage to the driving TFT is prevented such that a decrement of the current amount and the shortening lifetime of the driving TFT are prevented, and image deterioration such as image sticking decreases.

Meanwhile, in a switching TFT as opposed to a driving TFT, a current on/off characteristic (Ion/Ioff) is important, and thereby it is required to decrease an off current of the switching TFT. However, when the switching TFT is formed by a microcrystalline or polycrystalline semiconductor, the off current increases by grain boundaries such that a data voltage drop by the switching TFT occurs to cause cross talk. Thereby, in the embodiment of the present invention, since the switching TFT is formed of an amorphous semiconductor such as a-Si, of which occurrence of the off current is relatively low with respect to the microcrystalline or polycrystalline semiconductor, the data voltage drop is prevented and the cross talk decreases.

In the embodiment of the present invention, it is described that each of the pixels includes one switching TFT Qs and one driving TFT Qd, but they may further include at least one transistor and a plurality of wires for driving the transistor such that deterioration of the organic light emitting diode LD and the driving TFT Qs due to long time driving is prevented or compensated, to prevent a reduction of the life of the OLED.

A pixel electrode 191, an organic light emitting member 370, and the common electrode 270 form an OLED LD having the pixel electrode 191 as an anode and the common electrode 270 as a cathode, or vice versa. The overlapping portions of a storage electrode 127 and a driving voltage line 172 form a storage capacitor Cst.

Now, a method of manufacturing the OLED display shown in FIGS. 1 and 2 according to an embodiment of the present invention is described with reference to FIGS. 4-19 as well as FIGS. 1 through 3.

FIGS. 4, 7, 9, 12, 14, 16, and 18 are layout views of the OLED display shown in FIG. 2 in intermediate steps of a manufacturing method thereof according to an embodiment of the present invention. FIG. 5 is a sectional view of the OLED display shown in FIG. 4 taken along the lines V-V, and FIG. 6 illustrates the step following the step shown in FIG. 5. FIG. 8 is a sectional view of the OLED display shown in FIG. 7 taken along the lines VIII-VIII, FIG. 10 is a sectional view of the OLED display shown in FIG. 9 taken along the lines X-X, FIG. 11 illustrates the step following the step shown in FIG. 10, and FIG. 13 is a sectional view of the OLED display shown in FIG. 12 taken along the lines XIII-XIII. FIG. 15 is a sectional view of the OLED display shown in FIG. 14 taken along the lines XV-XV, FIG. 17 is a sectional view of the OLED display shown in FIG. 16 taken along the lines XVII-XVII, and FIG. 19 is a sectional view of the OLED display shown in FIG. 18 taken along the lines XIX-XIX.

Figure 4:
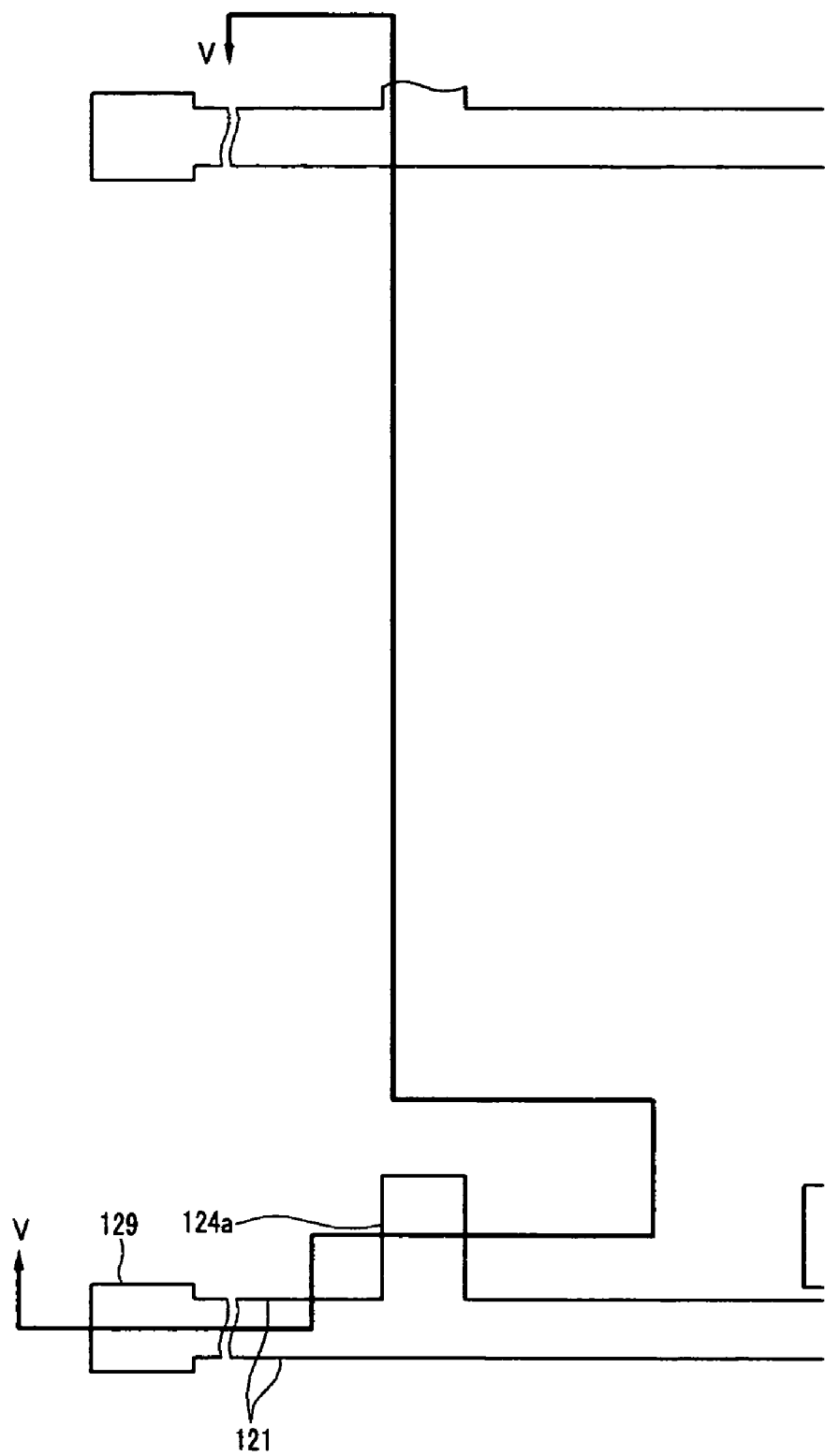
FIGS. 4, 7, 9, 12, 14, 16, and 18 are layout views of the OLED display shown in FIG. 2 in intermediate steps of a manufacturing method thereof according to an embodiment of the present invention.
Figure 5:
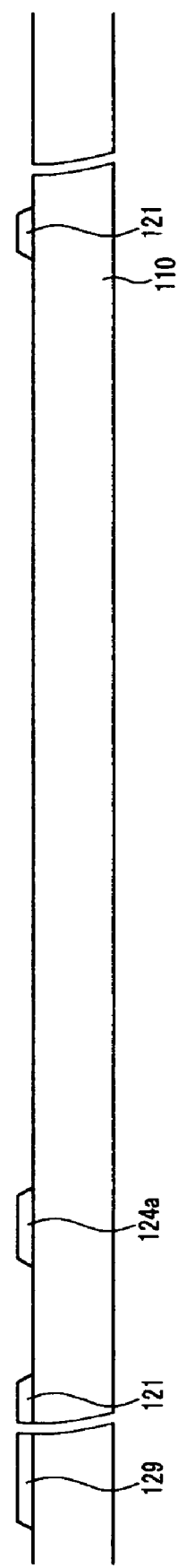
FIG. 5 is a sectional view of the OLED display shown in FIG. 4 taken along the lines V-V.
Figure 6:
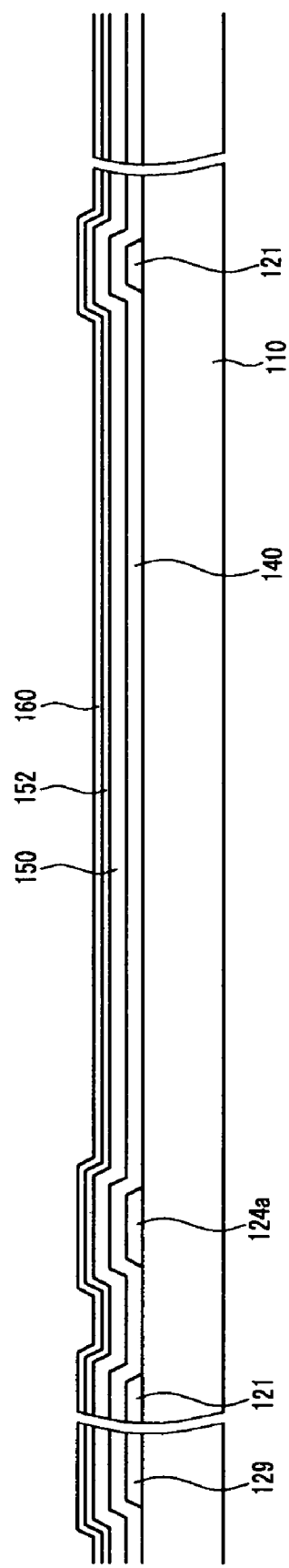
FIG. 6 illustrates the step following the step shown in FIG. 5.

Referring to FIGS. 4 and 5, a plurality of gate lines 121 made of an Al alloy are formed on a substrate. Each gate line 121 includes a first control electrode 124a and an end portion 129.

Next, referring to FIG. 6, a gate insulating layer 140, an intrinsic a-Si layer 150, a microcrystalline silicon layer 152, and the extrinsic a-Si layer 160 are sequentially deposited on the gate lines 121 by PECVD (plasma enhanced chemical vapor deposition).

Figure 7:
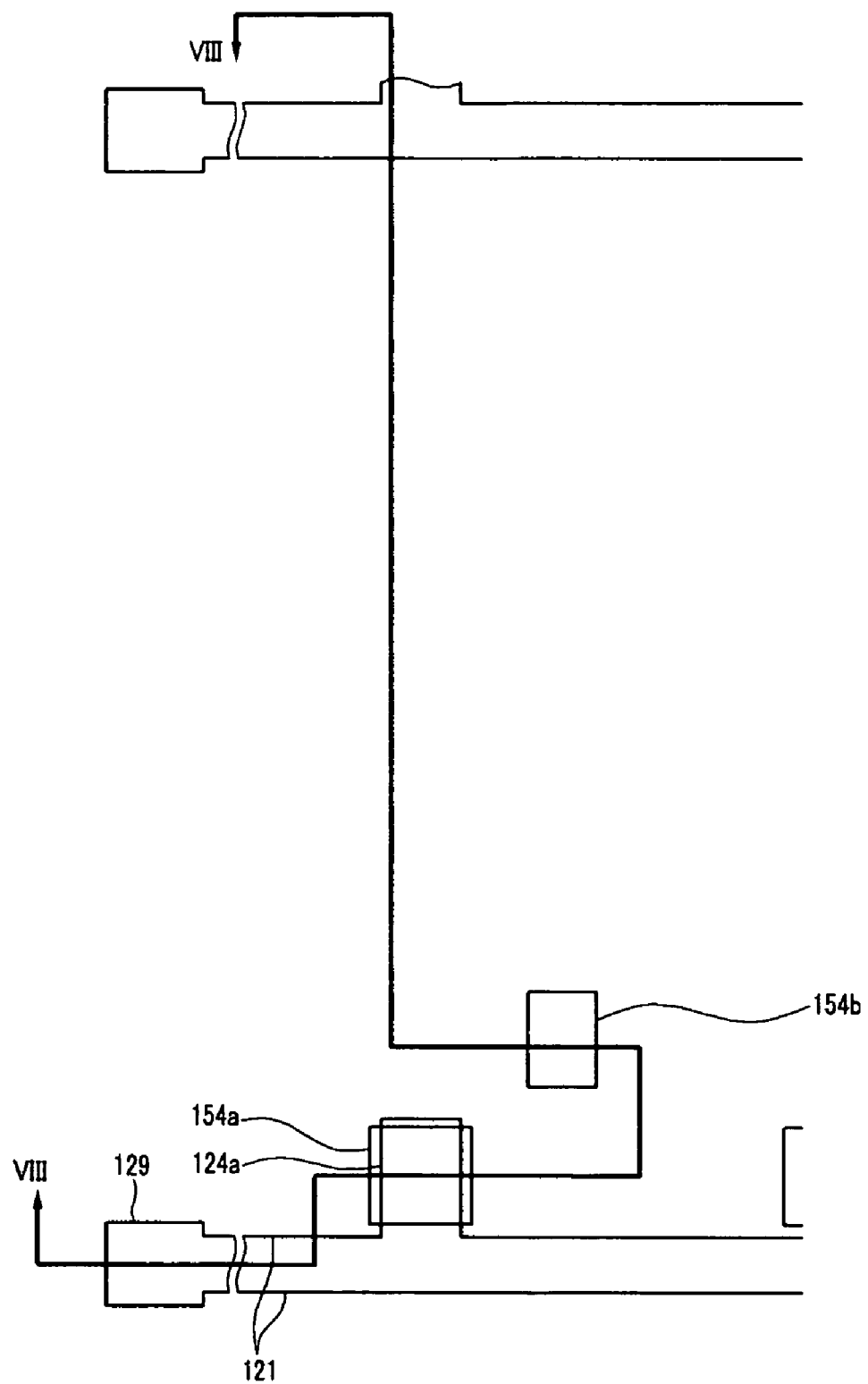
Figure 8:
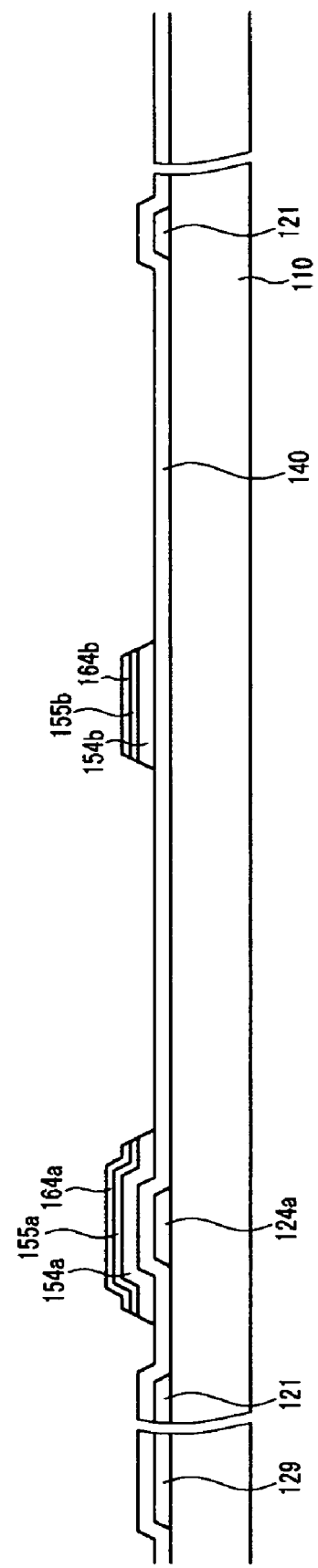
FIG. 8 is a sectional view of the OLED display shown in FIG. 7 taken along the lines VIII-VIII.

Referring to FIGS. 7 and 8, the extrinsic a-Si layer 160, the microcrystalline silicon layer 152, and the intrinsic a-Si layer 150 are etched by photolithography to form a plurality of first and second extrinsic a-Si layers 164a and 164b, a plurality of first and second upper semiconductor islands 155a and 155b, and a plurality of first and second lower semiconductor islands 154a and 154b.

Figure 9:
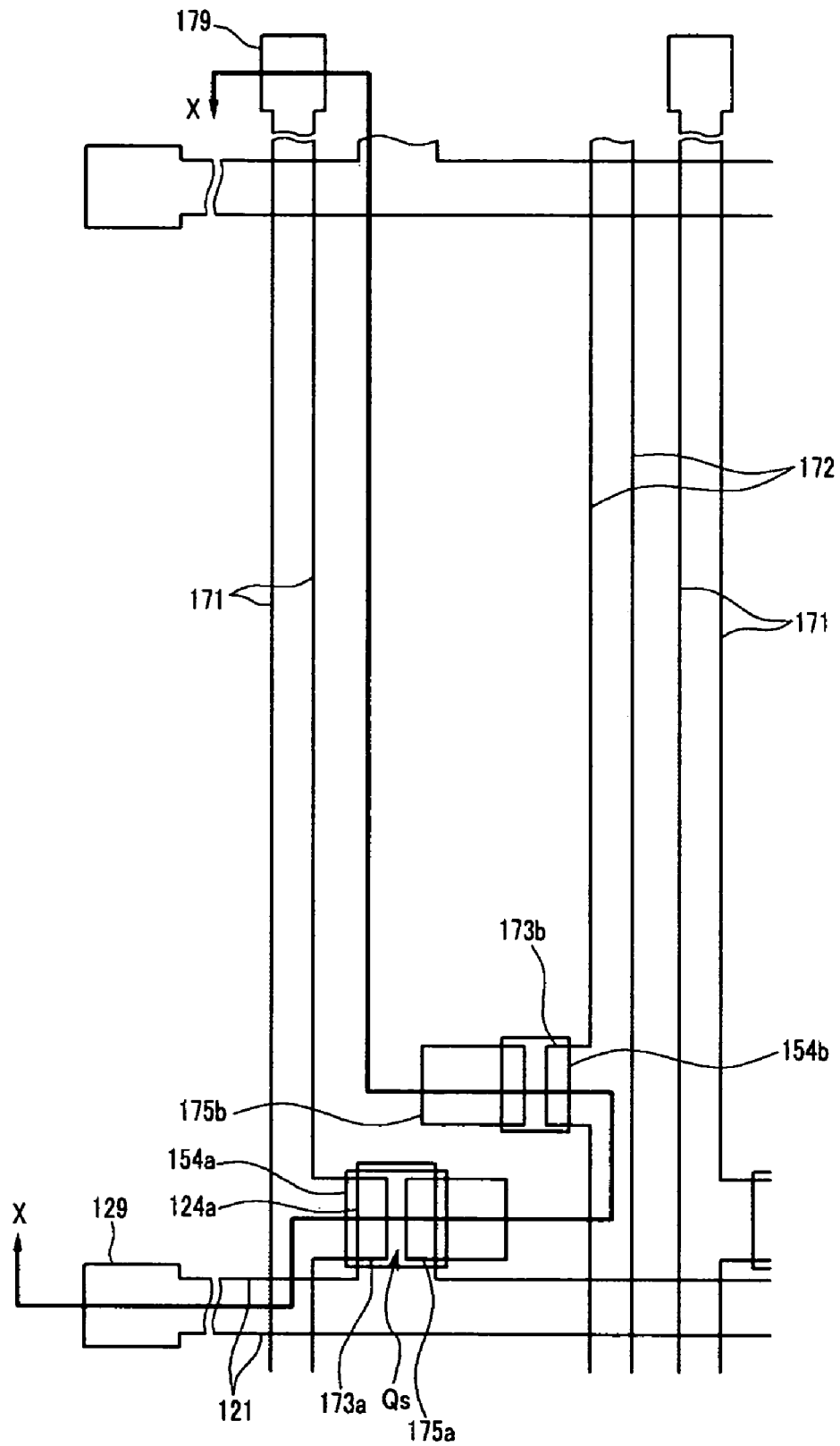
Figure 10:
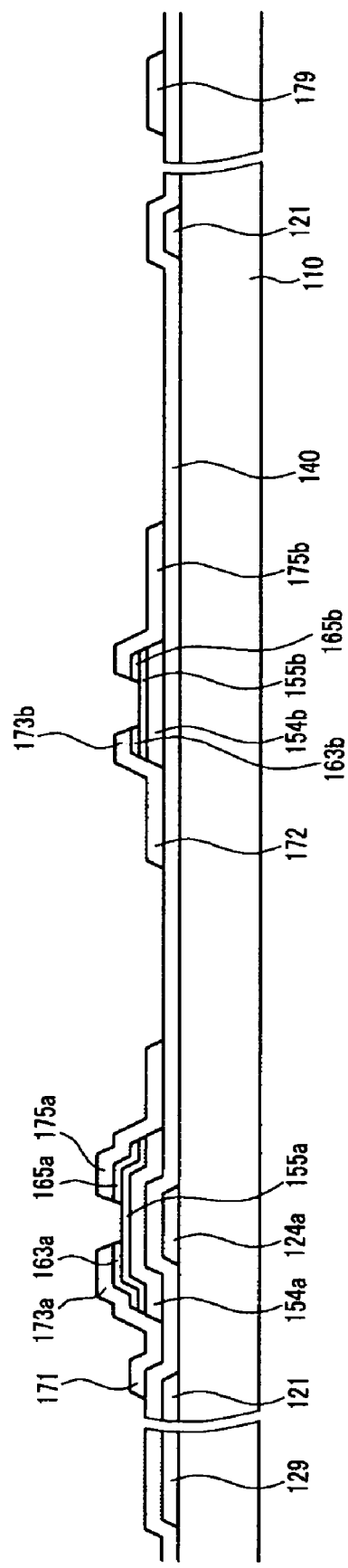
FIG. 10 is a sectional view of the OLED display shown in FIG. 9 taken along the lines X-X.
Figure 11:
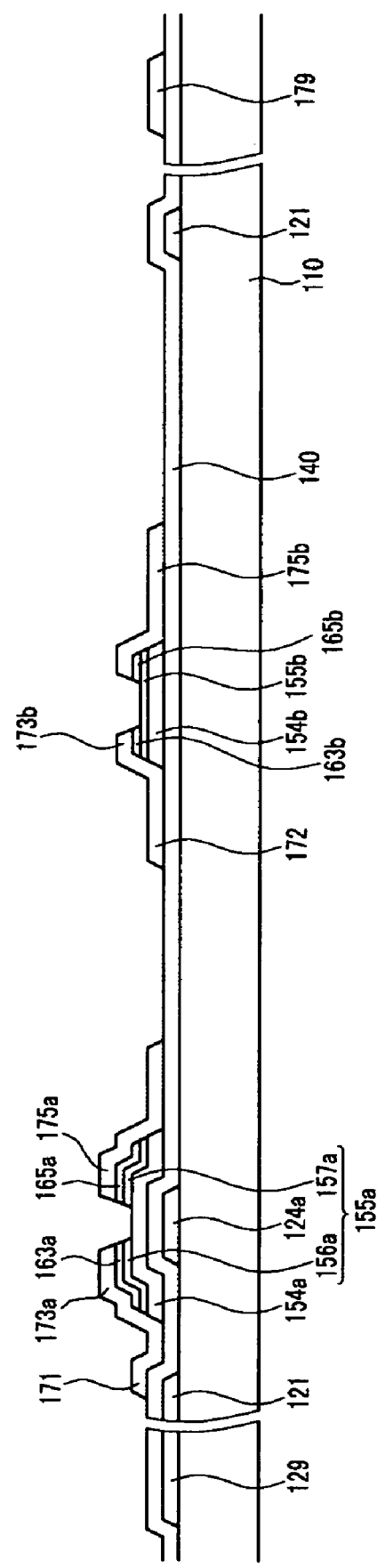
FIG. 11 illustrates the step following the step shown in FIG. 10.

Referring to FIGS. 9 and 10, data conductors including a plurality of data lines 171 having first input electrodes 173a and end portions 179, a plurality of driving voltage lines 172 having second input electrodes 173b, and a plurality of first and second output electrodes 175a and 175b and made of an Al alloy, in one example, are formed on the exposed gate insulating layer 140 and the first and second extrinsic semiconductors 164a and 164b.

Sequentially, ohmic contact islands 163a, 165a, 163b, and 165b are formed by removing the exposed first and second extrinsic a-Si layers 164a and 164b that are not covered by the data conductors 171, 172, 175a, and 175b, and the portions of the underlying first and second upper semiconductor islands 155a and 155b are exposed.

Referring to FIG. 11, the first upper semiconductor islands 155a are etched using the first input electrodes 173a and the first output electrodes 175a as a mask to form a pair of first and second portions of the first upper semiconductor islands 155a, which are separated from each other, and to expose the first lower semiconductor islands 154a.

As described above, by etching the first upper semiconductor islands 155a between the first input electrodes 173a and the first output electrodes 175b, channels of switching TFTs Qs are formed in the first lower semiconductor islands 154a, and the second upper semiconductor islands 155b between the second input electrodes 173b and the second output electrodes 175b are left to form channels of driving TFTs Qd.

Figure 12:
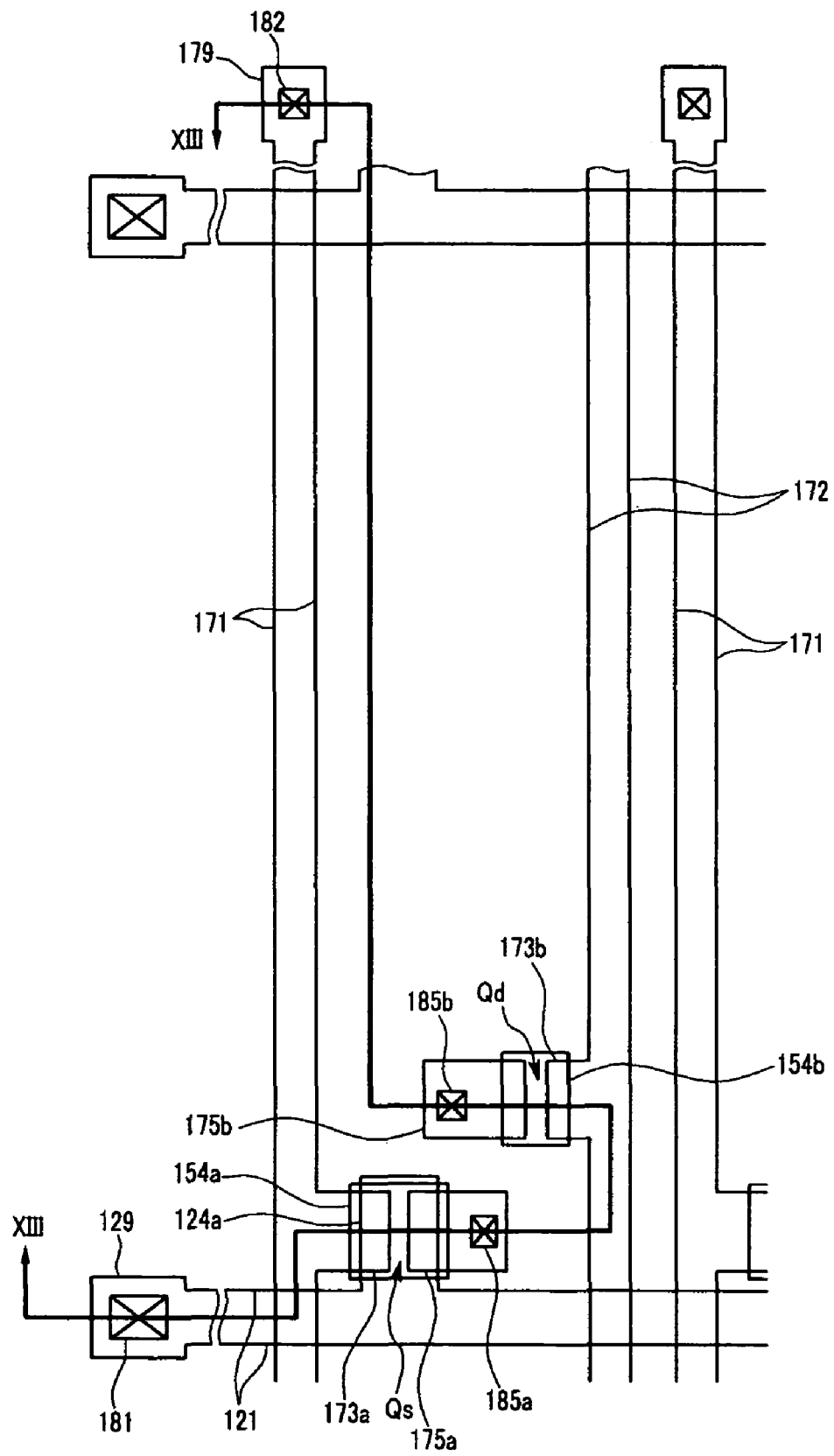
Figure 13:
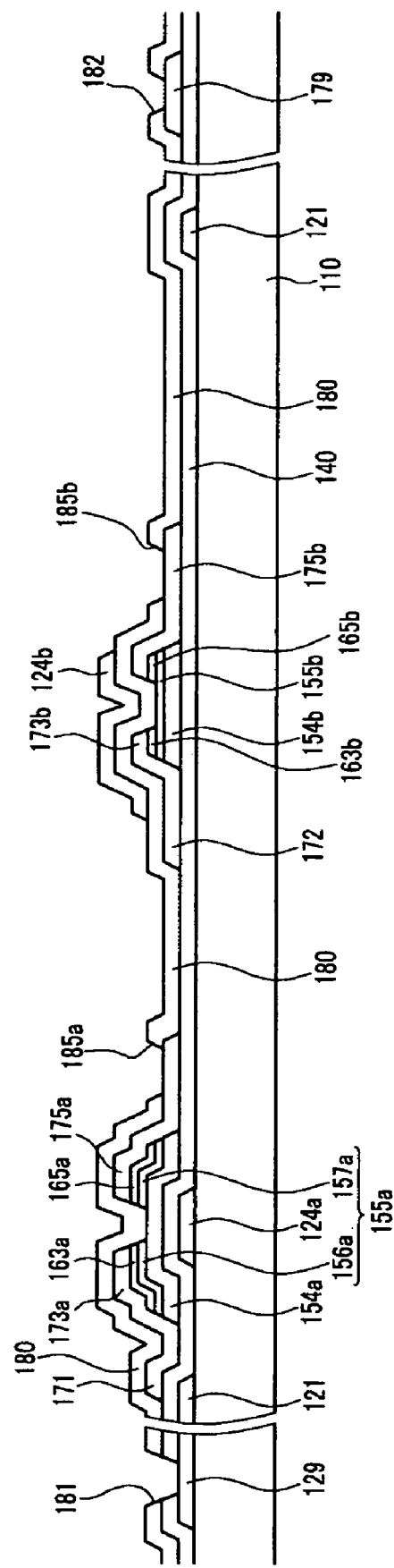
FIG. 13 is a sectional view of the OLED display shown in FIG. 12 taken along the lines XIII-XIII.

Next, referring to FIGS. 12 and 13, an upper gate insulating layer 180 is deposited on the data conductors 171, 172, 173a, 173b, 175a, and 175b, the exposed lower gate insulating layer 140, and the exposed semiconductor islands 154a and 155b by PECVD in one example. The upper gate insulating layer 180 is etched by photolithography to form a plurality of contact holes 181, 182, 185a, and 185b.

Figure 14:
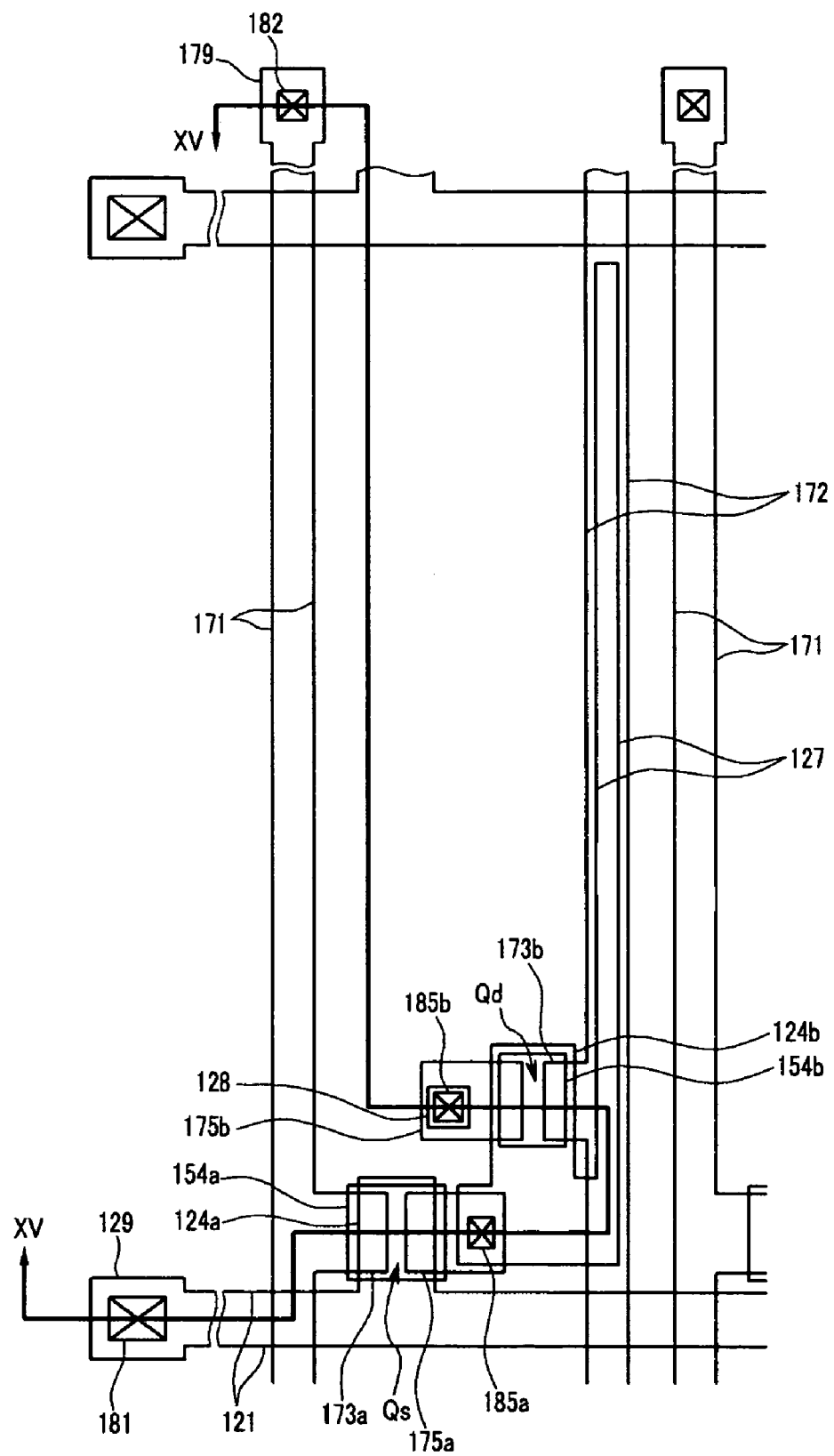
Figure 15:
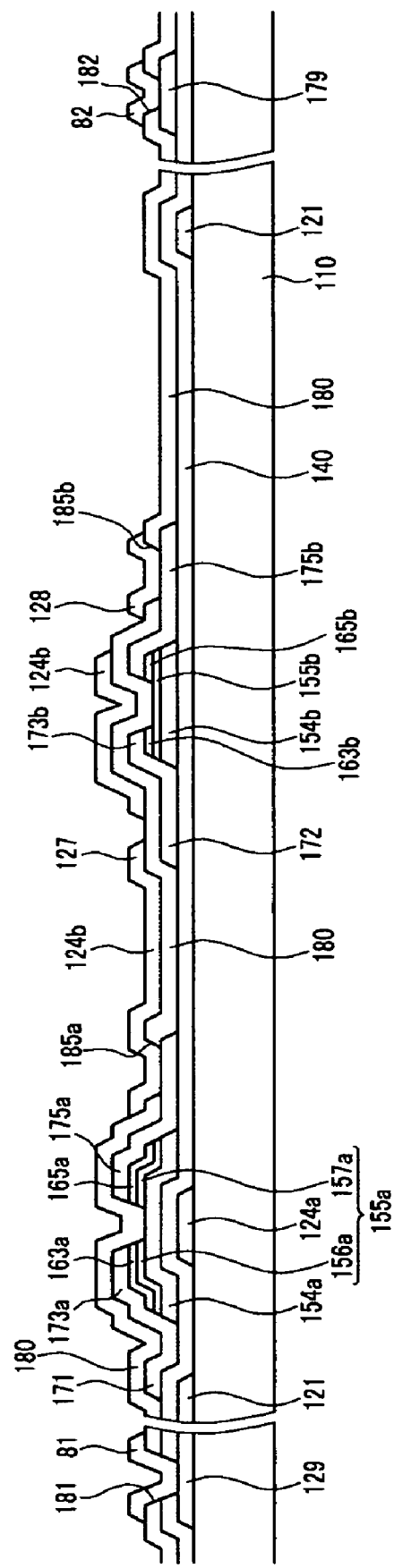
FIG. 15 is a sectional view of the OLED display shown in FIG. 14 taken along the lines XV-XV.

Referring to FIGS. 14 and 15, a conductive layer made of an Al alloy are deposited and etched by photolithography to form second control electrodes 124b including storage electrodes 127 and a plurality of auxiliary members 128.

Figure 16:
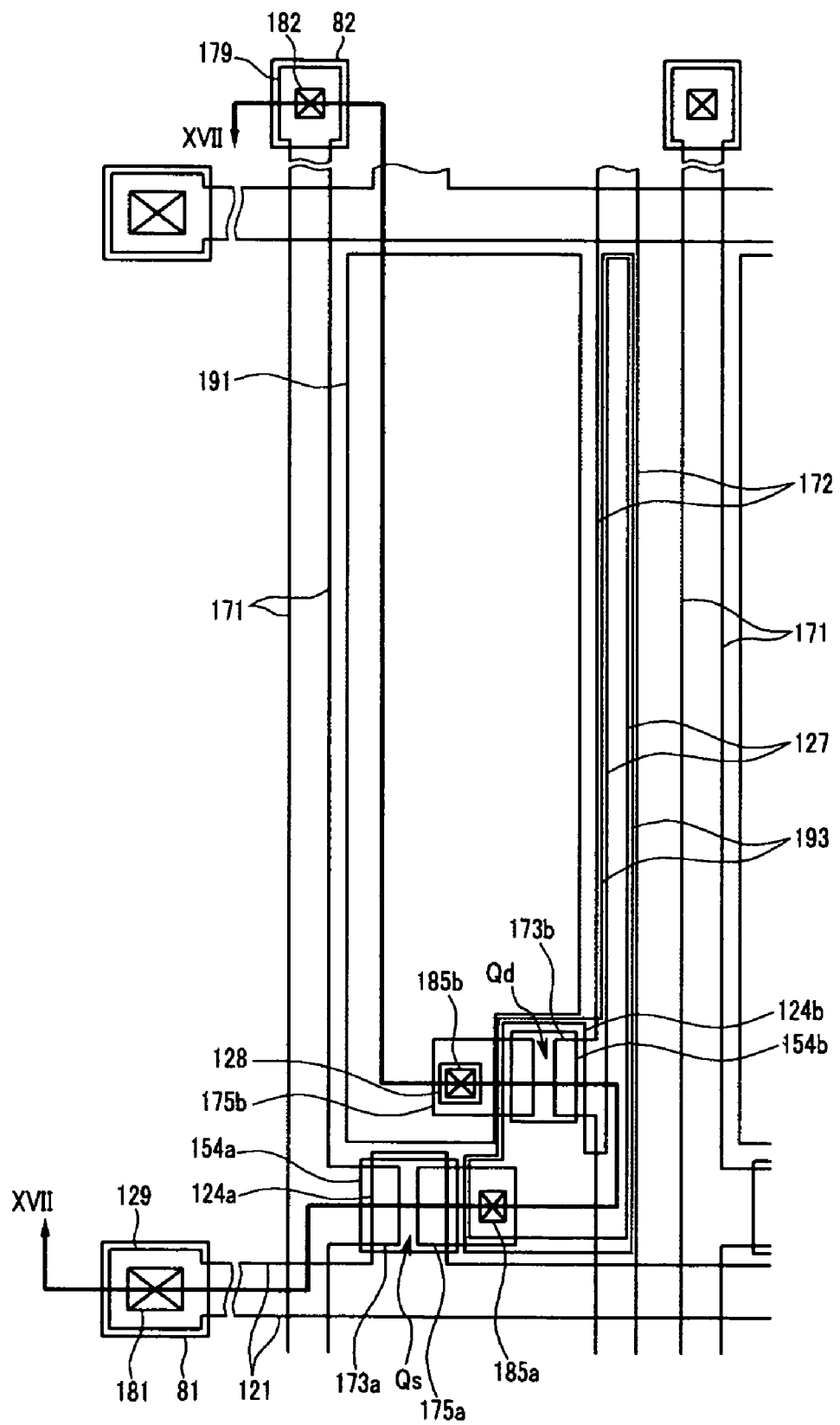
Figure 17:
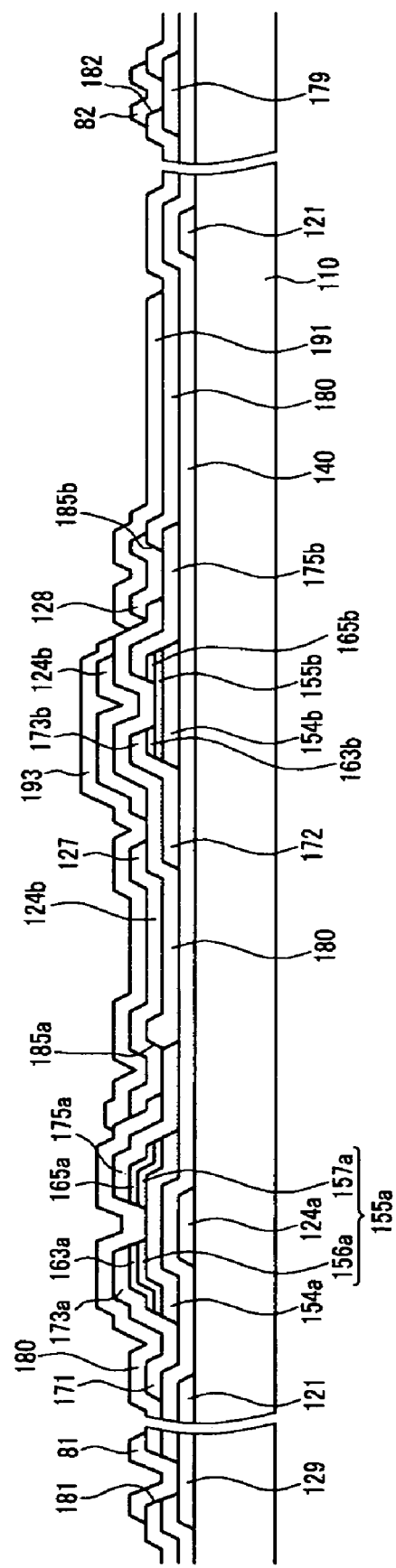
FIG. 17 is a sectional view of the OLED display shown in FIG. 16 taken along the lines XVII-XVII.

Referring to FIGS. 16 and 17, a plurality of pixel electrodes 191, a plurality of protecting members 193, and a plurality of contact assistants 81 and 82 are formed on the upper gate insulating layer 180 and the second control electrodes 124b by depositing ITO and etching by photolithography.

Figure 18:
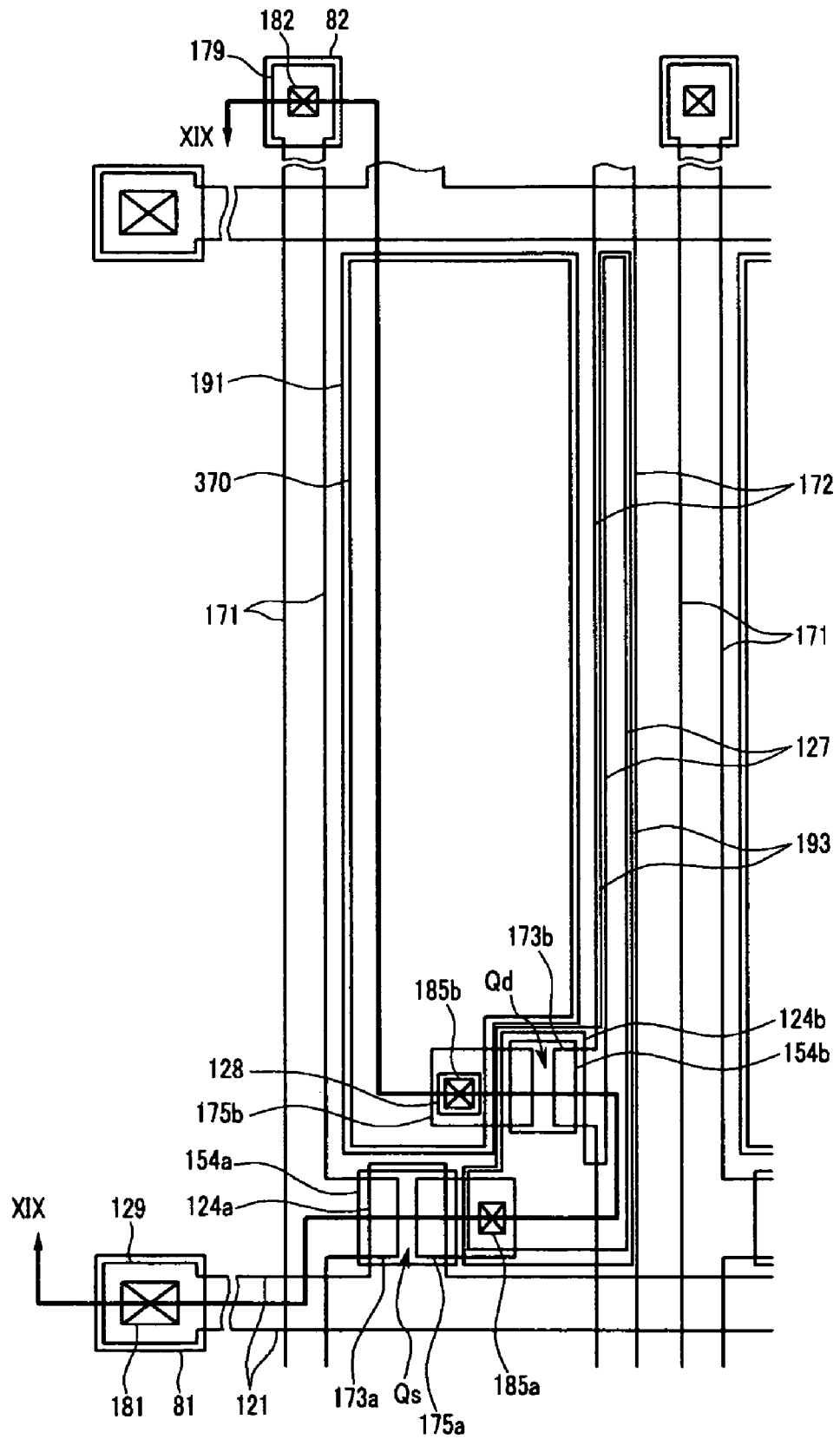
Figure 19:
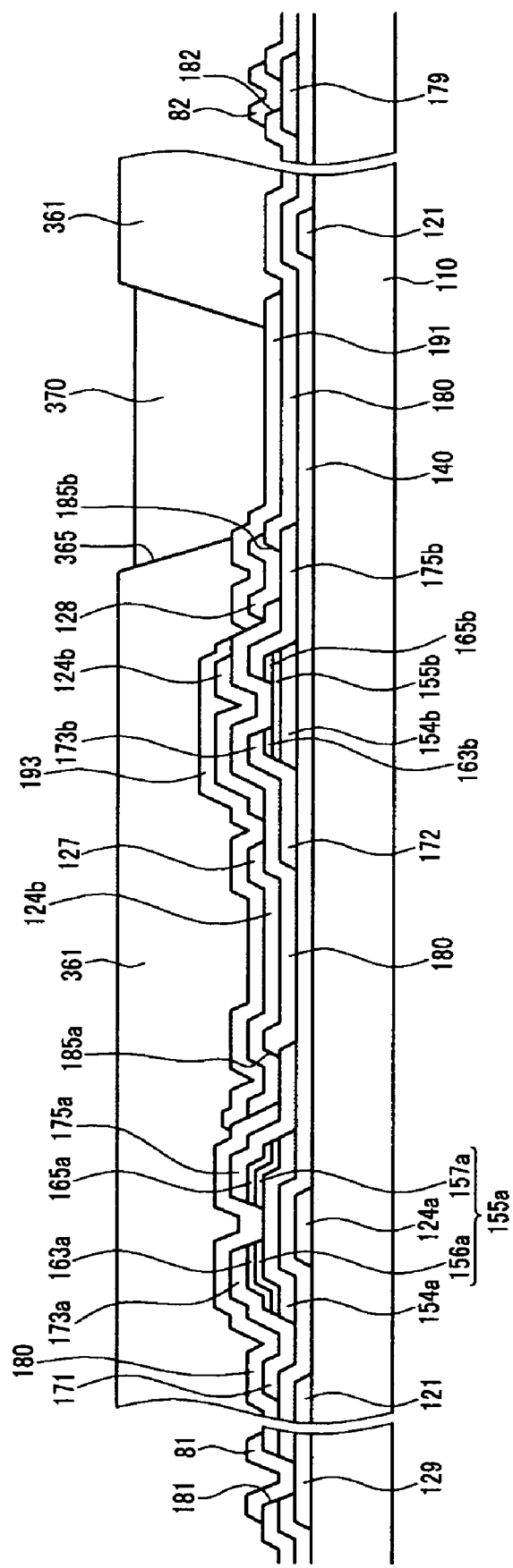
FIG. 19 is a sectional view of the OLED display shown in FIG. 18 taken along the lines XIX-XIX.

As shown in FIGS. 18 and 19, after depositing a photosensitive organic layer on the pixel electrodes 191, protecting members 193, and the upper gate insulating layer 180, the organic layer is exposed to light and developed to form a partition 361 including a plurality of openings 365.

Thereafter, a plurality of organic light emitting members 370 of which each includes a hole transport layer (not shown) and an emitting layer (not shown) are formed on the pixel electrodes 191 and confined in the openings 365. The organic light emitting members 370 may be formed by a solution process such as an inkjet printing or a depositing process. The formation of the organic light emitting members 370 may be formed by inkjet printing that sprays solution into the openings 365 while moving an inkjet head (not shown), and in this case, a drying step for removing solvent follows.

Next, referring to FIGS. 2 and 3, a common electrode 270 is formed on the partitions 361 and the organic light emitting members 370.

According to the present invention, the semiconductors are formed in a double-layered structure for improving characteristics of the switching TFTs and the driving TFTs, while the switching TFTs have a bottom gate structure and the driving TFTs have a top gate structure. Alternatively, the switching TFTs may have the top gate structure and the driving TFTs may have the bottom gate structure. In either case, when the switching TFT and the driving TFT have the different gate structures, a control electrode of the switching TFT and input and output electrodes of the driving TFT or a control electrode of the driving TFT and input and output electrodes of the switching TFT, are formed using one mask such that the number of masks is reduced to simplify manufacturing processes.

In addition, according to the present invention, the data voltage drop in the switching TFT and the decrement of the current amount applied to an OLED are prevented, thereby increasing the life of the OLED and decreasing the image deterioration.

While this invention has been described in connection with several embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate;
   a first signal line formed on the substrate;
   a second signal line intersecting the first signal line;
   a first thin film transistor connected to the first and second signal lines;
   a second thin film transistor connected to the first thin film transistor;
   a first electrode connected to the second thin film transistor;
   a second electrode provided at least partially opposite to the first electrode; and
   a light emitting member formed between the first electrode and the second electrode,
   wherein the first thin film transistor comprises a first lower semiconductor layer and a first upper semiconductor layer having different crystallinity from that of the first lower semiconductor layer, and the second thin film transistor comprises a second lower semiconductor layer and a second upper semiconductor layer having different crystallinity from that of the second lower semiconductor layer,
   wherein each of the first lower semiconductor layer and the second lower semiconductor layer comprises an amorphous semiconductor, and each of the first upper semiconductor layer and the second upper semiconductor layer comprises a microcrystalline or polycrystalline semiconductor.

2. The organic light emitting diode display of claim 1, wherein the first upper semiconductor layer and the second upper semiconductor layer have different planar shapes from each other.

3. The organic light emitting diode display of claim 1, wherein the first thin film transistor further comprises:
a first control electrode connected to the first signal line;
a first input electrode connected to the first signal line; and
a first output electrode opposite to the first input electrode, wherein the first lower semiconductor layer is formed on the first control electrode and the first upper semiconductor layer is formed between the first lower semiconductor layer and the first input and output electrodes.

4. The organic light emitting diode display of claim 3, wherein the first thin film transistor includes a channel formed in the first lower semiconductor layer.

5. The organic light emitting diode display of claim 3, wherein the first upper semiconductor layer comprises a pair of first and second portions opposite to the first control electrode.

6. The organic light emitting diode display of claim 5, further comprising a first ohmic contact having substantially the same planer shape as the first upper semiconductor layer.

7. The organic light emitting diode display of claim 3, wherein the second thin film transistor further comprises:
a second input electrode formed on the second lower semiconductor layer and the second upper semiconductor layer;
a second output electrode formed on the second lower semiconductor layer and the second upper semiconductor layer and opposite to the second input electrode; and
a second control electrode connected to the first output electrode and overlapping portions of the second input electrode and the second output electrode on the second input electrode and the second output electrode.

8. The organic light emitting diode display of claim 7, wherein the second thin film transistor includes a channel formed in the second upper semiconductor layer.

9. The organic light emitting diode display of claim 7, wherein the second lower semiconductor layer and the second upper semiconductor layer have substantially the same planer shape.

10. The organic light emitting diode display of claim 7, further comprising a first gate insulating layer formed between the first control electrode and the first lower semiconductor layer and a second gate insulating layer formed between the second upper semiconductor layer and the second control electrode.

11. The organic light emitting diode display of claim 7, further comprising a protecting member formed on the second control electrode and including substantially the same material as the first electrode.

12. The OLED display of claim 1, further comprising a partition formed on the first electrode, defining a light emitting member.

13. The organic light emitting diode display of claim 1, wherein a first channel of the first thin film transistor has different crystallinity from a second channel of the second thin film transistor.

14. An organic light emitting diode display, comprising:
a substrate;
a first signal line formed on the substrate;
a second signal line intersecting the first signal line;
a driving voltage line formed on the substrate substantially parallel to the first signal line or the second signal line;
a first thin film transistor including a first control electrode connected to the first signal line, a first input electrode connected to the second signal line, a first output electrode opposite to the first input electrode, and a first semiconductor layer overlapping portions of the first input electrode and the first output electrode;
a second thin film transistor including a second control electrode connected to the first output electrode, a second input electrode connected to the driving voltage line, a second output electrode opposite to the second input electrode, and a second semiconductor layer overlapping portions of the second input electrode and the second output electrode;
a first electrode connected to the second output electrode;
a second electrode provided at least partially opposite to the first electrode; and
a light emitting member formed between the first electrode and the second electrode,
wherein the first control electrode and the second control electrode are formed on different layers from each other.

15. The organic light emitting diode display of claim 14, wherein the first control electrode is formed under the first semiconductor layer, and the second control electrode is formed on the second semiconductor layer.

16. The organic light emitting diode display of claim 14, wherein the first semiconductor layer comprises a first lower semiconductor layer and a first upper semiconductor layer having different crystallinity from that of the first lower semiconductor layer, and the second semiconductor layer comprises a second lower semiconductor layer and a second upper semiconductor layer having different crystallinity from that of the second lower semiconductor layer.

17. The organic light emitting diode display of claim 16, wherein each of the first lower semiconductor layer and the second lower semiconductor layer comprises an amorphous semiconductor, and each of the first upper semiconductor layer and the second upper semiconductor layer comprises a microcrystalline or polycrystalline semiconductor.

18. The organic light emitting diode display of claim 16, wherein the first upper semiconductor layer comprises a first portion and a second portion separated from each other on the first lower semiconductor layer.

19. The organic light emitting diode display of claim 16, wherein the second lower semiconductor layer and the second upper semiconductor layer have substantially the same planer shape.

20. The organic light emitting diode display of claim 14, further comprising first ohmic contacts formed between the first semiconductor layer and the first input electrode and between the first semiconductor layer and the first output electrode, and second ohmic contacts formed between the second semiconductor layer and the second input electrode and between the second semiconductor layer and the second output electrode.

21. The organic light emitting diode display of claim 20, wherein the first ohmic contact and the second ohmic contact comprise an amorphous semiconductor material doped with an impurity or a microcrystalline semiconductor material.

22. The organic light emitting diode display of claim 14, further comprising an auxiliary member formed on the second output electrode and the first electrode.

* * * * *